(12) United States Patent
Chen et al.

(10) Patent No.: US 9,875,982 B2
(45) Date of Patent: Jan. 23, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Ming-Fa Chen, Taichung (TW); Chen-Hua Yu, Hsinchu (TW); Ching-Pin Yuan, Changhua County (TW); Sung-Feng Yeh, Taipei (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 0 days.

(21) Appl. No.: 15/170,494

(22) Filed: Jun. 1, 2016

(65) Prior Publication Data
US 2017/0352634 A1    Dec. 7, 2017

(51) Int. Cl.
| H01L 23/52  | (2006.01) |
| H01L 23/00  | (2006.01) |
| H01L 23/29  | (2006.01) |
| H01L 23/48  | (2006.01) |
| H01L 23/498 | (2006.01) |

(52) U.S. Cl.
CPC ............. *H01L 24/16* (2013.01); *H01L 23/293* (2013.01); *H01L 23/481* (2013.01); *H01L 23/49816* (2013.01); *H01L 2224/1605* (2013.01); *H01L 2924/01029* (2013.01); *H01L 2924/3512* (2013.01)

(58) Field of Classification Search
CPC ..... H01L 24/16; H01L 23/293; H01L 23/481; H01L 23/49816
USPC .......................................................... 257/737
See application file for complete search history.

(56) References Cited

U.S. PATENT DOCUMENTS

| 7,564,115 | B2 |    | 7/2009  | Chen et al.              |
| 7,633,165 | B2 |    | 12/2009 | Hsu et al.               |
| 7,825,024 | B2 |    | 11/2010 | Lin et al.               |
| 7,973,413 | B2 |    | 7/2011  | Kuo et al.               |
| 8,105,875 | B1 |    | 1/2012  | Hu et al.                |
| 8,158,456 | B2 |    | 4/2012  | Chen et al.              |
| 8,183,578 | B2 |    | 5/2012  | Wang                     |
| 8,183,579 | B2 |    | 5/2012  | Wang                     |
| 8,227,902 | B2 |    | 7/2012  | Kuo                      |
| 8,278,152 | B2 |    | 10/2012 | Liu et al.               |
| 8,354,297 | B2 | *  | 1/2013  | Pagaila ........... H01L 25/16 257/678 |
| 8,426,961 | B2 |    | 4/2013  | Shih et al.              |
| 8,669,174 | B2 | *  | 3/2014  | Wu ............... H01L 21/6835 438/108 |
| 8,802,504 | B1 |    | 8/2014  | Hou et al.               |

(Continued)

*Primary Examiner* — Luan C Thai
(74) *Attorney, Agent, or Firm* — WPAT, P.C., Intellectual Property Attorneys; Anthony King

(57) ABSTRACT

A semiconductor device includes a first die, a second die bonding to the first die thereby forming a bonding interface, and a pad of the first die and exposed from a polymeric layer of the first die. The semiconductor device further has a conductive material on the pad and extended from the pad in a direction parallel to a stacking direction of the first die and the second die. In the semiconductor device, the conductive material extended to a top surface, which is vertically higher than a backside of the second die, wherein the backside is a surface opposite to the bonding interface.

20 Claims, 25 Drawing Sheets

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 2011/0215458 A1* | 9/2011 | Camacho ................ H01L 23/52 257/686 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

* cited by examiner

SEMICONDUCTOR DEVICE AND MANUFACTURING METHOD THEREOF

BACKGROUND

Electronic equipment involving semiconductor devices are indispensable from our daily life. With the advancement of electronic technology, electronic equipment become more complicated and involve greater amount of integrated circuitry for executing the desired multi-functionality. Thus, manufacturing of the electronic equipment includes more and more steps of assembly and processing as well as materials for producing the semiconductor devices in the electronic equipment. Therefore, there is a continuous demand on simplifying the steps of production, increasing production efficiency and lowering associated manufacturing cost on each of the electronic equipment.

During the operations of manufacturing the semiconductor devices, the semiconductor devices are assembled with numbers of integrated components including various materials with difference in thermal properties. As such, the integrated components are in undesired configurations. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
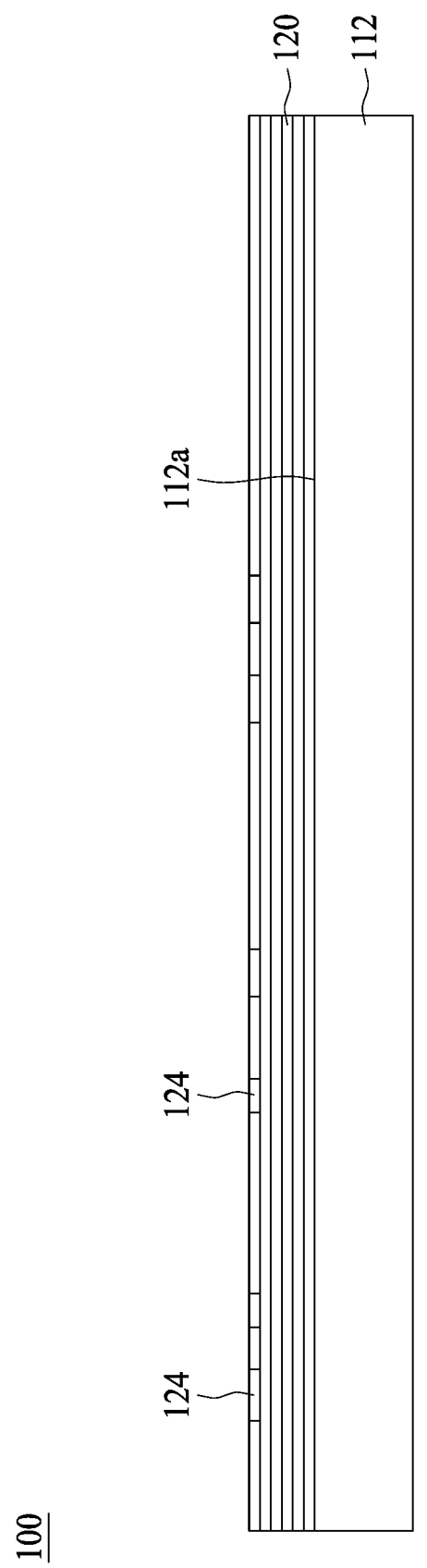
FIG. 1 is a schematic view of a semiconductor device with a die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conductor is provided as an electrically terminal of a bonded semiconductor structure in order to be connected with an external device through the conductor. The intermediate stages of manufacturing an embodiment are illustrated. The variations of the embodiment are discussed. Throughout the various views and illustrative embodiments, like reference numbers are used to designate like elements.

Referring to FIG. 1, die 100, which includes substrate 112 and integrated circuits (not shown in the drawing) therein. Substrate 112 may be a semiconductor substrate, such as a bulk silicon substrate, or other semiconductor materials such as group III, group IV, and/or group V elements. In some embodiments, the substrate may include silicon dioxide, aluminum oxide, sapphire, germanium, gallium arsenide (GaAs), an alloy of silicon and germanium, or indium phosphide (InP). Surface 112a is a front side of the substrate 112 and includes semiconductor devices such as transistors. Interconnect structure 120, which includes conductive lines and vias (not shown) formed therein, is formed on front side 112a of substrate 112 and connected to the active semiconductor devices. The conductive lines and vias may be formed of copper or copper alloys, and may be formed using the damascene processes. In some embodiments, the conductive lines are formed through single damascene or dual damascene operations and at least six to seven layers of conductive lines are included in the interconnect structure 120. Interconnect structure 120 may include inter-layer dielectric (ILD) and inter-metal dielectrics (IMDs) between different conductive line. In some embodiments, the ILD or IMD includes dielectric material such as silicon oxide, silicon nitride, silicon oxynitride, low-k dielectric material, or other suitable dielectric material, and/or combinations thereof.

In some embodiments, the ILD or IMD is disposed by a deposition. Deposition may be a vapor deposition including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD. In some embodiments, the ILD or IMD is disposed by a spin coating. Top conductive pads 124 of the interconnect structure 120 are at least partially exposed from the dielectric of the interconnect structure 120. Surface 112b is opposite to surface 112a, and is called "backside" of substrate 112 throughout the description.

Figure 2:
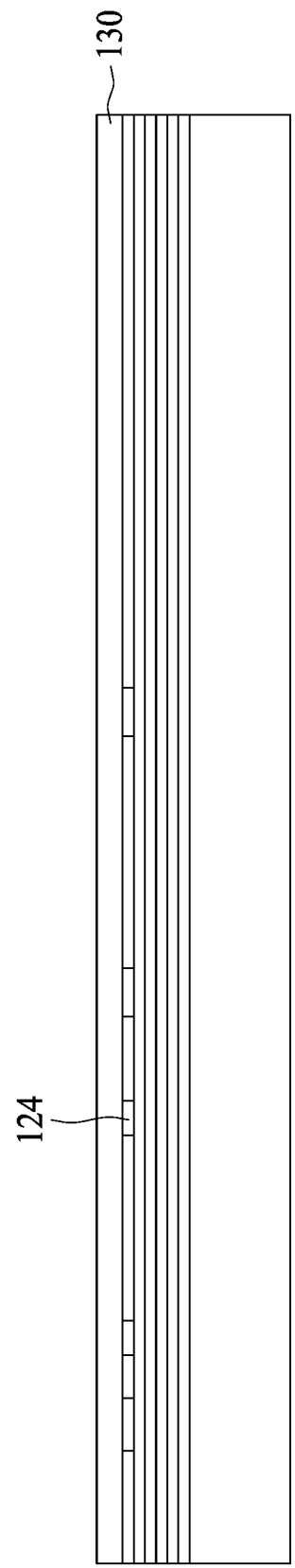
FIG. 2 is a schematic view of a semiconductor device with a conductive layer in accordance with some embodiments.

Referring to FIG. 2, another conductive layer 130 is disposed on the interconnect pads 124. In another embodiment, conductive layer 130 is optional. The material or composition of the conductive layer 130 may be different from the conductive pads 124. In some embodiments, the conductive layer 130 is formed of aluminum or aluminum alloys, and may be more vulnerable to etchant containing chlorine or fluorine than conductive pads 124. In some embodiments, a material selection criterion for conductive layer 130 is to ensure an ohmic contact can be formed between conductive layer 130 and conductive pads 124.

Figure 3:
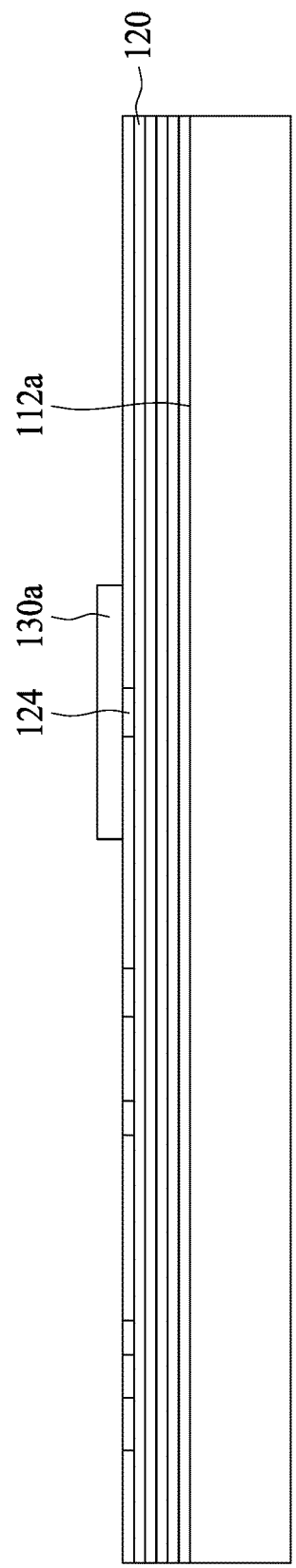
FIG. 3 is a schematic view of a semiconductor device with a pad in accordance with some embodiments.

Referring to FIG. 3, conductive layer 130 is partially removed to form at least one pad 130a over the front side 112a. Pad 130a also covers at least one conductive pad 124, which is exposed from the dielectric of interconnect structure 120. Pad 130a is in direct contact with the conductive pad 124 such that die 100 can communicate with an external device through pad 130a. In some embodiments, pad 130a, has a dimension larger than the conductive pad 124 underneath from a top-down perspective. Conductive pad 124 is hidden underneath pad 130a, from top view.

Figure 4:
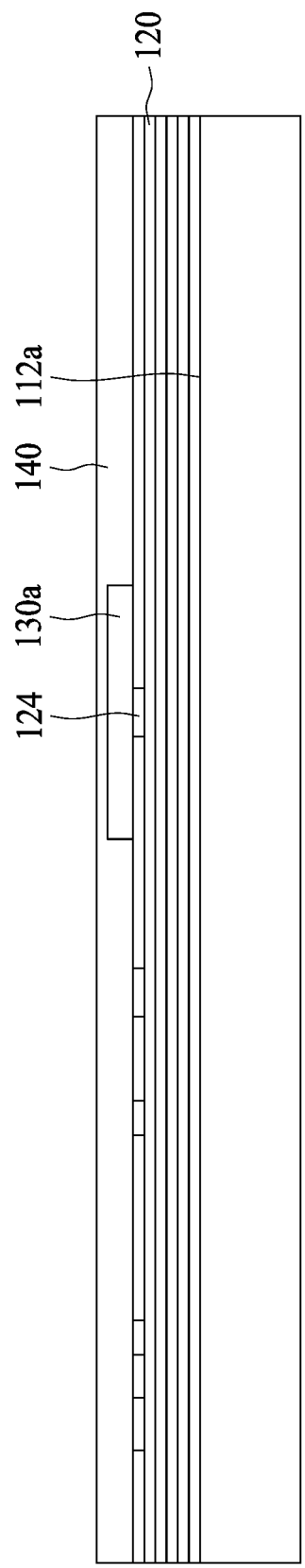
FIG. 4 is a schematic view of a semiconductor device with a dielectric material in accordance with some embodiments.

Referring to FIG. 4, dielectric material 140 is disposed over front side 112a. In some embodiments, dielectric material 140 covers and contacts with conductive pad 124, pad 130a, and top surface of interconnect structure 120. In some embodiments, dielectric material 140 is coated over front side 112a. In some embodiments, dielectric material 140 is deposited over front side 112a.

Deposition may be a vapor deposition including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD. The layer 104 may include dielectric material such as silicon oxide, silicon nitride, silicon oxynitride, high-k dielectric material, low-k dielectric material, other suitable dielectric material, and/or combinations thereof. Examples of high-k dielectric materials include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. However, this is not a limitation of the present disclosure.

Figure 5:
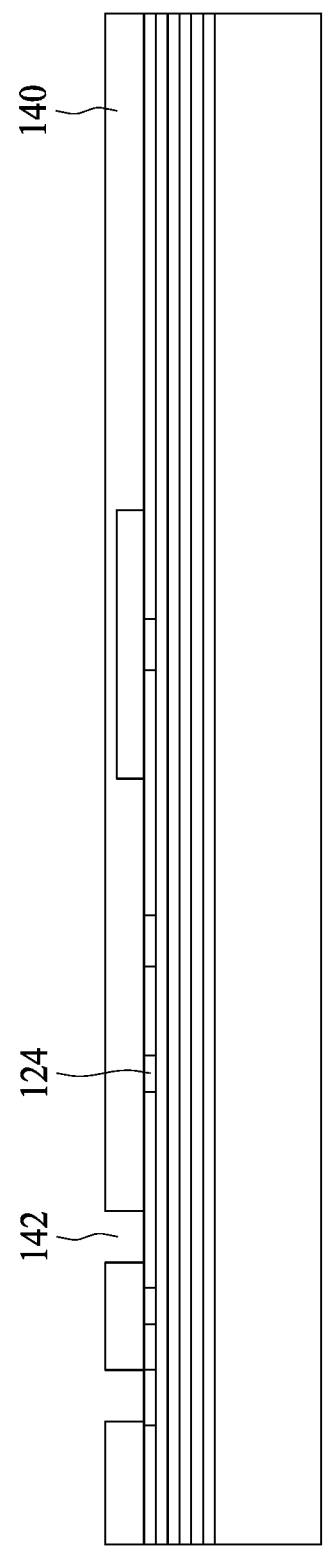
FIG. 5 is a schematic view of a semiconductor device with through holes in accordance with some embodiments.

Referring to FIG. 5, dielectric material 140 is patterned to include several through holes 142. Some conductive pads 124 under dielectric material 140 are exposed via through holes 142. The patterning operation performed on dielectric material 140 may include several sub-operations. For example, a photoresist is firstly disposed over dielectric material 140 and patterned into a designed mask. A portion of dielectric material 140 is masked by the photoresist. Then an etch operation is adopted to remove the unmasked portions of dielectric material 140.

Figure 6:
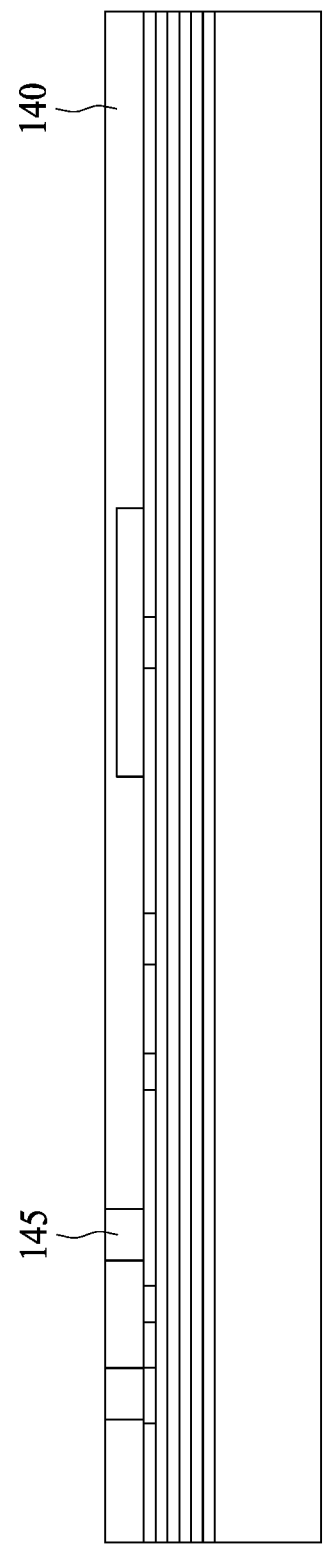
FIG. 6 is a schematic view of a semiconductor device with conductive pillars in accordance with some embodiments.

Referring to FIG. 6, conductive material is filled in through holes 142 to form conductive pillars 145. In some embodiments, conductive material is filled with at least two stages. In a first stage, a thin conductive layer is disposed conformally into through holes 142. The thin conductive layer is a seed layer and may include Cu, Ti, Ta, TiN, TaN, or the like, using CVD or PVD techniques. For example, in an embodiment, the thin conductive layer is a composite layer including a layer of Ti is deposited by a PVD process to a thickness of about 500 Å. In the second stage, another conductive material is filled on the seed layer. The filling conductive material can be copper or copper alloy and filled by an electro plating operation. Some through holes 142 may be overfilled by the filling conductive material such that dielectric material 140 is covered thereby. A CMP operation is adopted to remove excessive filling material and form pillars 145 as shown in FIG. 6. Pillars 145 are extended through dielectric material 140 in order to provide contact for an external device.

Figure 7:
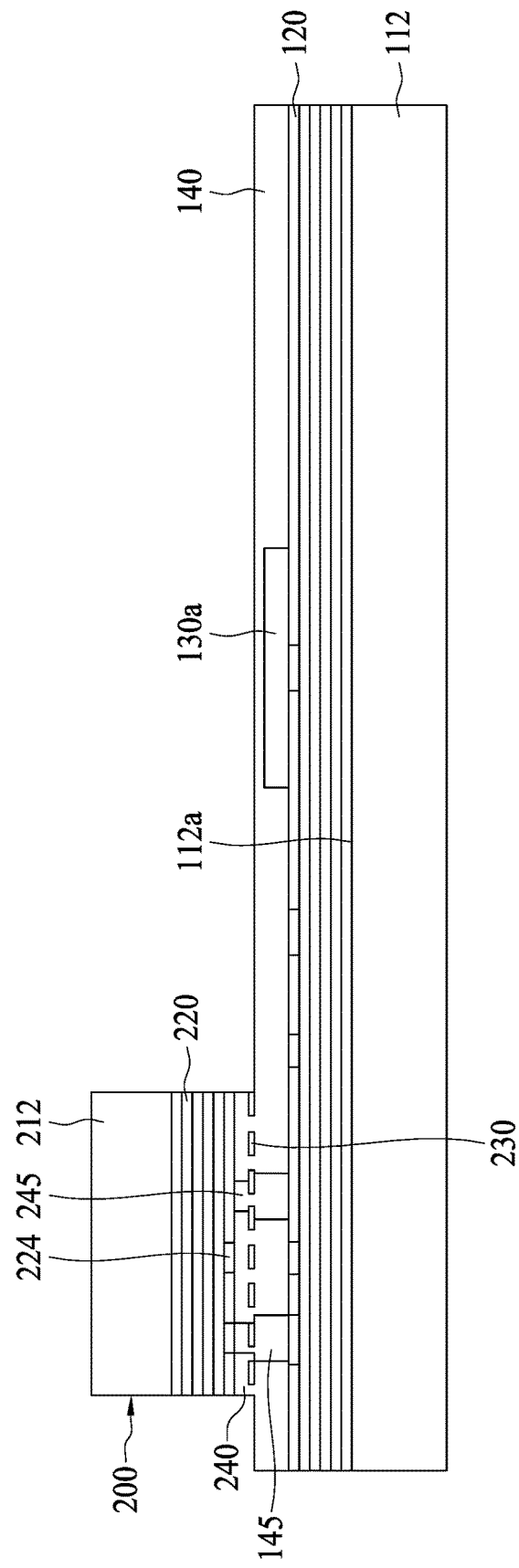
FIG. 7 is a schematic view of a semiconductor device with another die in accordance with some embodiments.

Referring to FIG. 7, another die 200 is disposed vertically over the front side 112a of the substrate 112. In some embodiments, die 200 is a semiconductor chip singulated from a wafer. Before disposing over the front side 112a, die 200 may be experienced a series of wafer level semiconductor operations. For example, a semiconductor wafer is provided and active and passive devices such as CMOS, diode, etc. are formed in the semiconductor substrate. Interconnect layer 220 similar to interconnect 120 may be included and disposed over the active surface of die 200. On the upper most level of the interconnect 120, a dielectric 240 is disposed as a passivation layer to isolate moisture penetrating into the interconnect layer 220, however, some conductive pads 224 are exposed from the dielectric layer 240. The die 200 may be then singulated from the wafer and relocated to be over the substrate 112. Conductive pillar 245 is disposed on exposed conductive pads 224 and acts as an electrical communication terminal of die 200. Conductive pillar 245 can be disposed on exposed conductive pads 224 before or after the singulation operation.

In FIG. 7, die 200 is bonded with die 100. A surface of die 200 is facing toward die 100 and configured to be bonded with die 100. First surface 230 may include exposed surface of conductive pad 224 and surface of dielectric layer 240. Bonding between die 200 and 100 may include at least three different bonding types. One of bonding is a metal-to-metal bonding, for example, conductive pillar 245 of die 200 is bonded to conductive pillar 145 of die 100. The second type is a direct dielectric-to-dielectric bonding, for example, the direct dielectric-to-dielectric bonding is observed at the interface between dielectric layer 140 and dielectric layer 240. The second type is a metal-to-dielectric bonding. The third type is metal-to-dielectric bonding, which is on the interface between conductive pillar 145 and dielectric layer 240, or the interface between conductive pillar 245 and dielectric layer 140. Once die 100 is bonded with die 200, electrical communication path is formed through the connection of conductive pillar 145 and conductive pillar 245. In addition to electrical connection, mechanical connection is also formed between die 100 and die 200 through the dielectric-to-dielectric bonding or the metal-to-dielectric bonding. Once die 200 is bonded with die 100, a bonding interface 230 may be observed between die 200 and die 100 under a SEM. In some embodiments, a slope stain may be applied to the cross section in order to show the interface 230.

Figure 8:
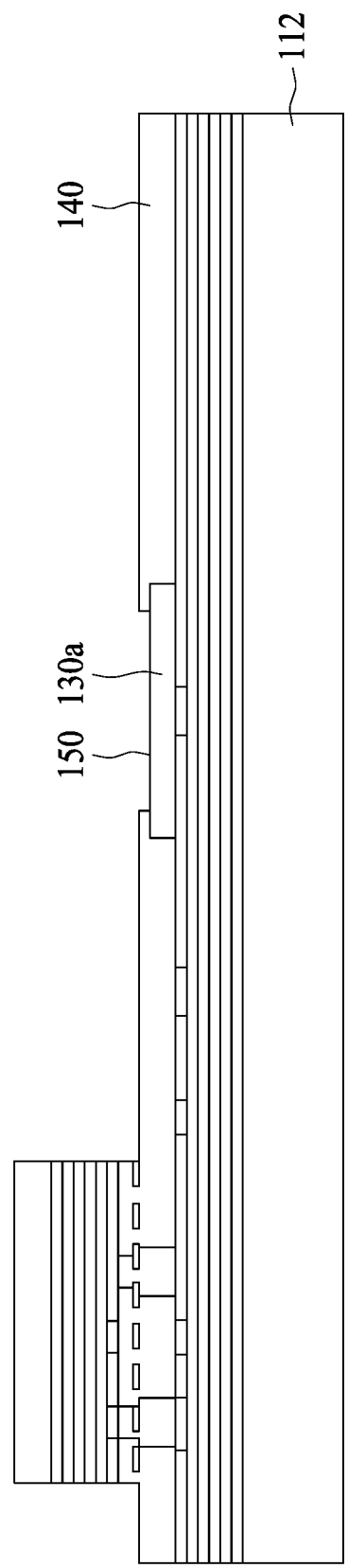
FIG. 8 is a schematic view of a semiconductor device with an exposure of the pad in accordance with some embodiments.

Referring to FIG. 8, dielectric layer 140 is partially removed in order to expose pad 130a. In some embodiments, the removal portion is smaller than the width of pad 130a so as to have the pad 130a still partially covered by the dielectric layer 140. The dielectric layer 140 is recessed at pad 130a and have surface 150 exposed.

Figure 9:
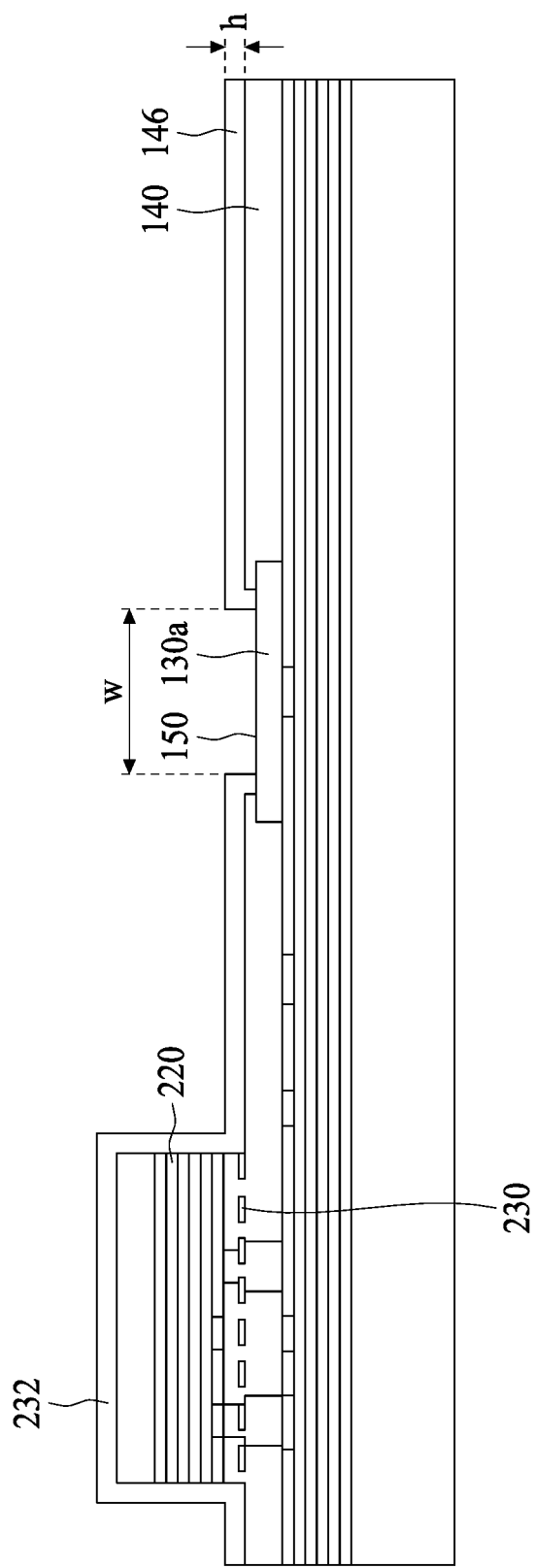
FIG. 9 is a schematic view of a semiconductor device with a polymeric layer in accordance with some embodiments.

Referring to FIG. 9, a polymeric layer 146 is optionally disposed over the dielectric layer 140 and the die 200. A portion of the polymeric layer 146 is removed in order to have a through hole overlapped with the recess of the dielectric layer 140. In some embodiments, surface 150 of the pad 130a is partially exposed from the dielectric layer 140 and polymeric layer 146. In some embodiments, width w of the exposed surface 150 is between about 10 um and about 100 um. In some embodiments, width w is between about 15 um and about 95 um. In some embodiments, width w is between about 25 um and about 85 um. In some embodiments, a width of the through hole is substantially smaller than a width of the recess of the dielectric layer 140.

In some embodiments, the polymeric layer 146 has a thickness h between about 2 um and 15 um. In some embodiments, the polymeric layer 146 has a thickness h between about 3 um and 13 um. In some embodiments, the polymeric layer 146 has a thickness h between about 4 um and 11 um.

In some embodiments, die 200 is covered by the polymeric layer 146. Die 200 has a backside 232, which is a surface opposite to the bonding interface 230, covered by the polymeric layer 146. In some embodiments, backside 232 is at least partially exposed from the polymeric layer 146. The interconnect layer 220 is substantially surrounded by the polymeric layer 146. In some embodiments, the interconnect layer 220 is partially surrounded by the polymeric layer 146. Photo sensitive material can be selected to form the polymeric layer 146. For example, polyimide is selected to be spin coated on over the dielectric layer 140. A reticle is used in a stepper or scanner to define the pattern to be transferred to the photo sensitive material through an exposure operation under a predetermined wavelength light. The exposed photo sensitive material is further developed such that a portion of the photo sensitive material is removed to form a through hole or other designated pattern in the photo sensitive material. Examples of polyimide films include Apical, Kapton, UPILEX, VTEC PI, Norton TH and Kaptrex. In some embodiments, other photo sensitive material such as Polybenzoxazole (PBO), Benzocyclobuten (BCB), Silicones, Acrylates and Epoxy are also suitable material.

Figure 10:
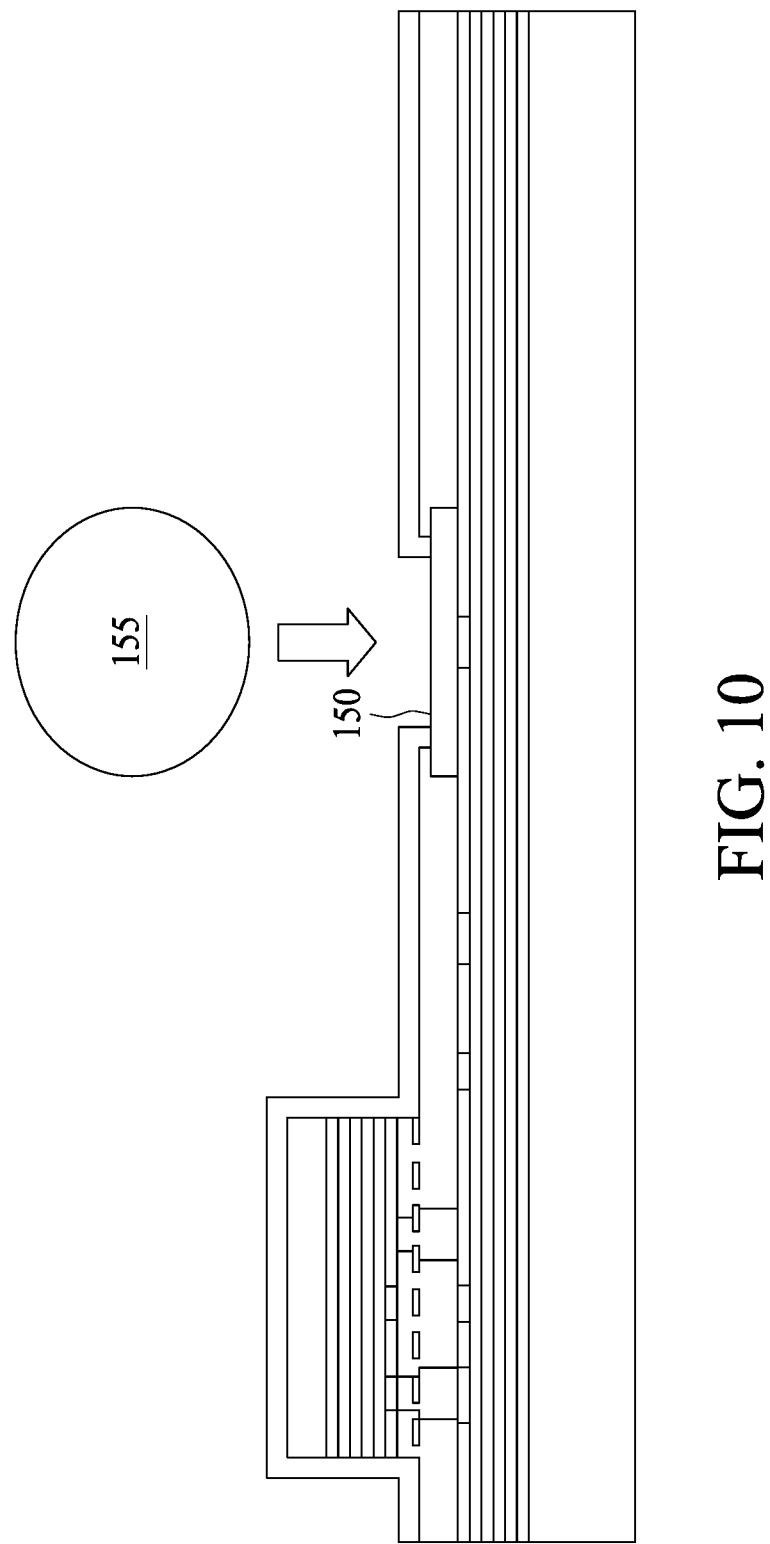
FIG. 10 and FIG. 10A are schematic views of a semiconductor device with a to-be-disposed conductive material in accordance with some embodiments.
Figure 10A:
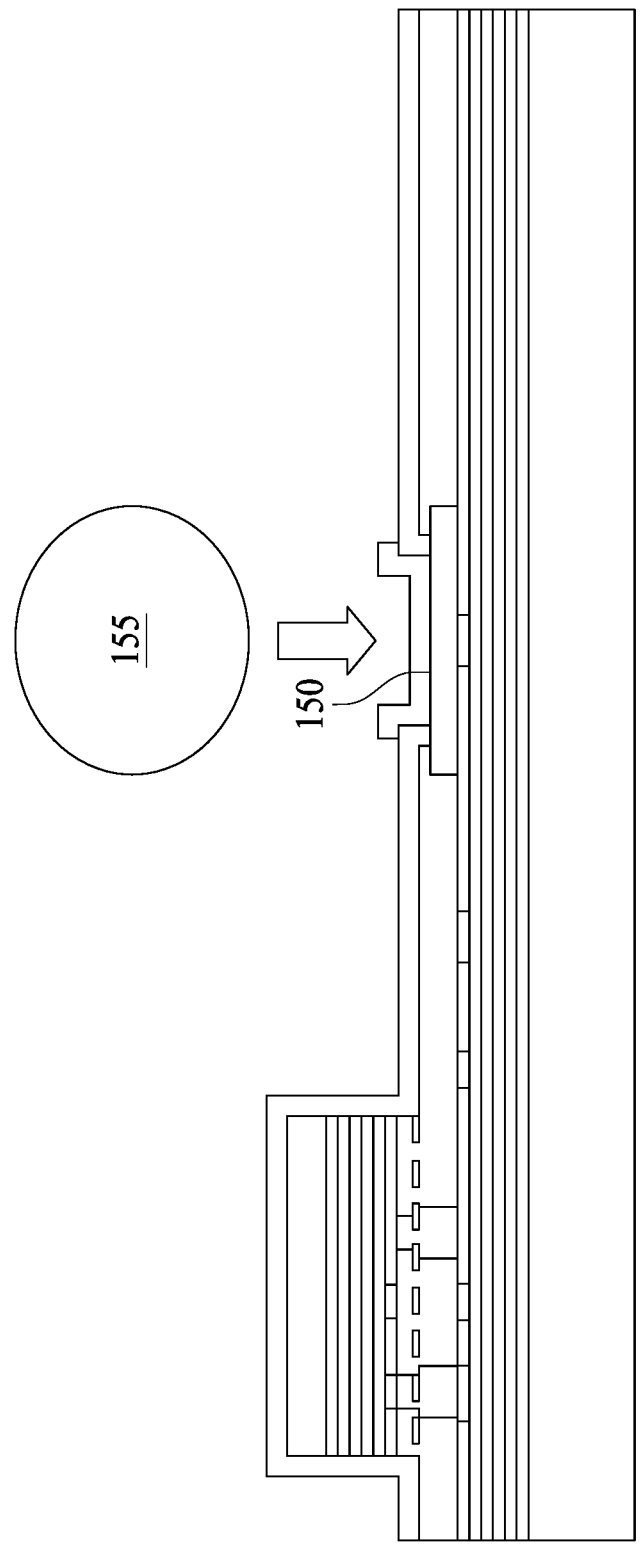

Referring to FIG. 10, a conductive material 155 is configured to be disposed on the exposed surface 150. There may be some other layers interposed between the conductive material 155 and exposed surface 150. In some embodiments, an under bump metallurgy (UBM) is disposed between the conductive material 155 and exposed surface 150 as in FIG. 10A. In some embodiments, conductive material 155 includes solder material such as alloy of Sn, Ag, Cu, Zn, Pb, Sb, Bi, In, Cd, Au, Cd, Si, Ge, or the like.

In some embodiments, conductive material 155 is disposed on the exposed surface 150 through a stencil disposed over exposed surface 150 wherein the stencil has a through hole aligned with the exposed surface 150. The conductive material 155 is a solder ball like material and dropped through the through hole. The conductive material 155 is finally landed on the exposed surface 150. In some embodiments, conductive material 155 is disposed through pasting a solder material on the exposed surface 150.

In some embodiments, a flow/reflow operation with an elevated temperature is introduced after the conductive material 155 is landed exposed surface 150. Temperature of flow/reflow operation is preferred to be high enough to have the solder ball or solder paste heated to increase mobility of thereof.

Figure 11:
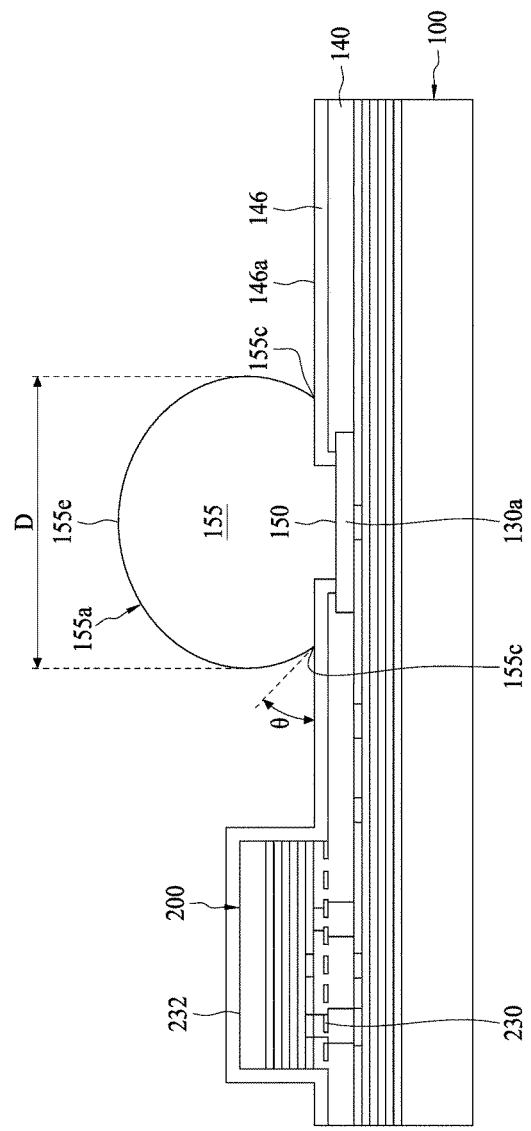
FIG. 11 and FIG. 11A are schematic views of a semiconductor device with a conductive material in accordance with some embodiments.

Referring to FIG. 11, the conductive material 155 is deformed and fills the through hole in the polymeric layer 146. A eutectic bonding may be formed between the conductive material 155 and pad 130a. The conductive material 155 is extended through the through hole in the polymeric layer 146 and dielectric layer 140. The conductive material 155 is also in contact with the exposed surface 150 of pad 130a. Through the bonding between die 100 and 200, die 200 is further electrically communicating with conductive material 155 through die 100. Therefore, conductive material 155 is a conductive terminal of the integrated bonded structure, which includes die 100 and die 200. Die 200 can be further electrically coupled to a device external to die 100 or die 200 through pad 130a.

In some embodiments, conductive material 155 overfills the through hole in polymeric layer 146 and further covers a portion of polymeric layer 146. Conductive material 155 is extended from the exposed surface 150 of pad 130a then turns laterally and attach along top surface 146a of polymeric layer 146. The lateral extension of conductive material 155 is ended at a turning point 155c and then changes upwardly to form a curve intersected with the top surface 146a.

The curve 155a is an external surface of the conductive material 155 and is configured to be in contact with another electronic component or circuitry external to the integrated bonded semiconductor die structure. An angle θ is formed at the intersection of curve 155a and top surface 146a of polymeric layer 146. The value of θ is determined by the surface tension between conductive material 155 and polymeric layer 146. In the embodiment in FIG. 11, conductive material 155 is repelled to polymeric layer 146 and angle θ is smaller than about 90 degrees. In some embodiments, the angle θ is smaller than about 80 degrees. In some embodiments, the angle 9 is a wetting angle between conductive material 155 and polymeric layer 146.

The conductive material 155 has a maximum width D measured along the direction parallel to surface 146a. In some embodiments, maximum width D is between about 50 um and 100 um. In some embodiments, maximum width D is between about 50 um and 150 um. In some embodiments, maximum width D is between about 100 um and 150 um. In some embodiments, maximum width D is between about 100 um and 200 um. In some embodiments, maximum width D is between about 200 um and 250 um. In some embodiments, maximum width D is between about 250 um and 300 um. In some embodiments, maximum width D is between about 50 um and 300 um. In some embodiments, maximum width D is greater than about 10 um.

The conductive material 155 is protruded from pad 130a and continues extended laterally along surface 146a of polymeric material 146. In some embodiments, a portion of the conductive material 155 is in a hemisphere shape and possesses a diameter. In some embodiments, the diameter is substantially equal to the maximum width D.

Conductive material 155 has a top surface 155e, which is opposite to surface 150. Conductive material 155 is extended from surface 150 to top surface 155e. In the present disclosure, extension or protruding direction of conductive material 155 is defined as a direction substantially parallel to the stacking direction of die 100 and die 200. The direction herein is also defined as a vertical direction. The top surface 155e of conductive material 155 is at a vertical level which is higher than backside 232 of die 200.

Figure 11A:
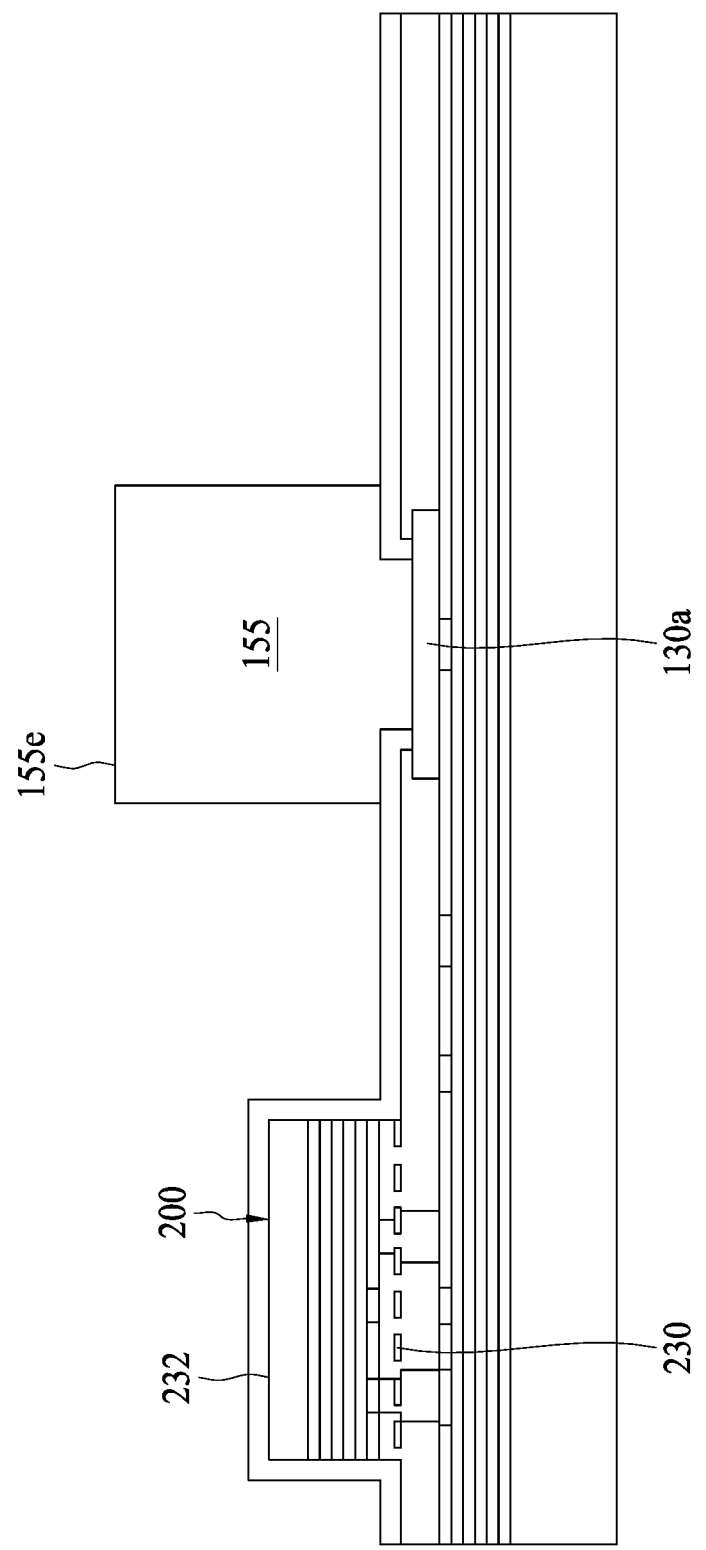

In some embodiments, conductive material 155 is a conductor such as a conductive pillar or a micro bump. As in FIG. 11A, conductive material 155 is defined in pillar shape. Conductive material 155 is protruded from pad 130a and extended vertically to top surface 155e. Top surface 155e is vertically higher than the surface (or backside) 232 of die 200.

Figure 12:
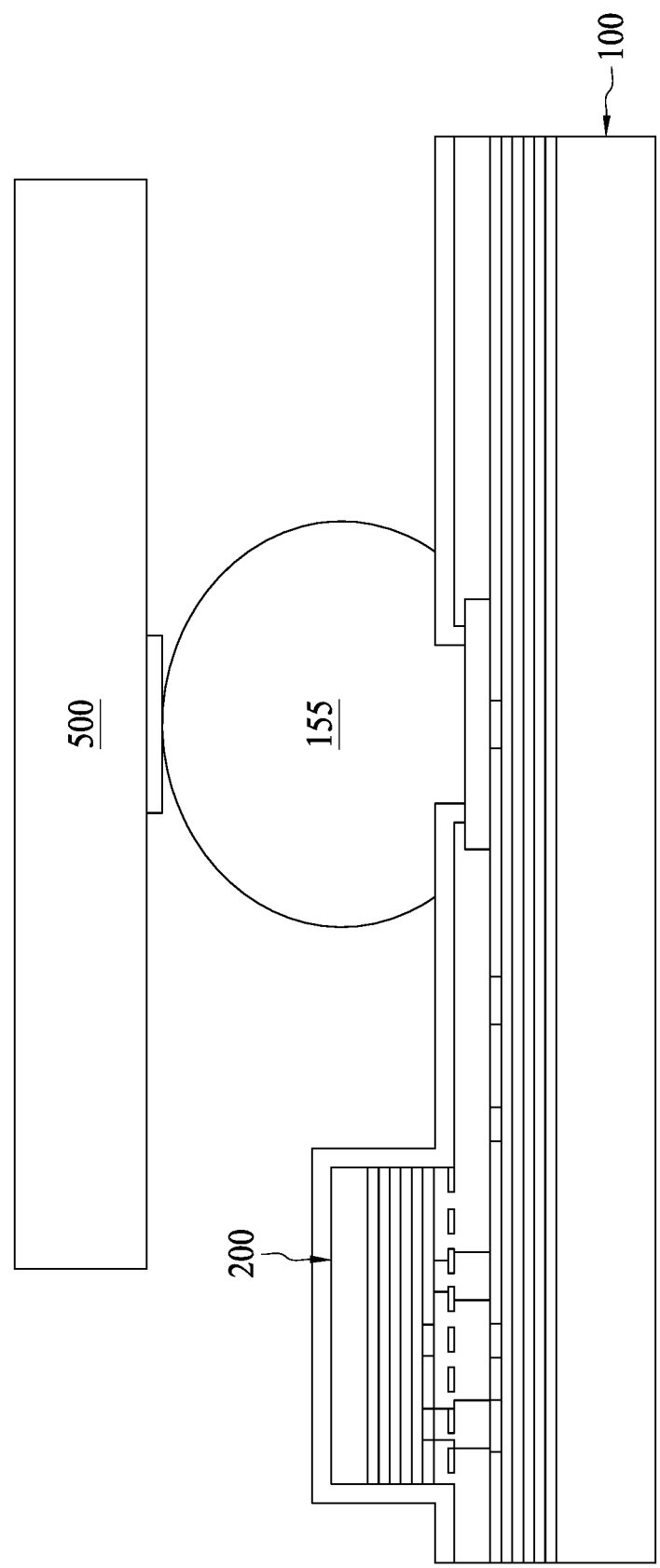
FIG. 12 is a schematic view of a semiconductor device bonding with another substrate in accordance with some embodiments.

Referring to FIG. 12, another substrate 500 is electrically connected to conductive material 155. Through conductive material 155, substrate 500 is electrically communicated with die 100 or die 200. In some embodiments, die 100, die 200, and substrate 500 are arranged in a vertical stacking manner to form a three dimensional (3D) semiconductor device.

Figure 13:
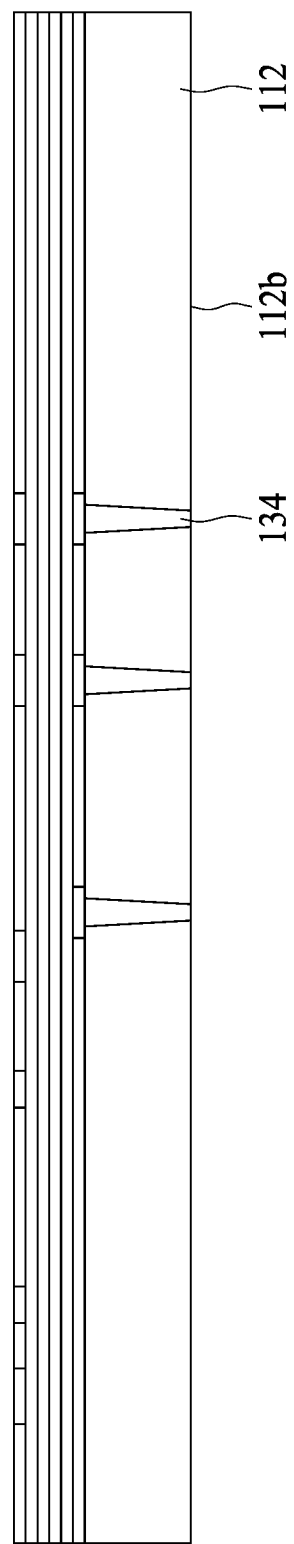
FIG. 13 is a schematic view of a semiconductor device with a die in accordance with some embodiments.
Figure 14:
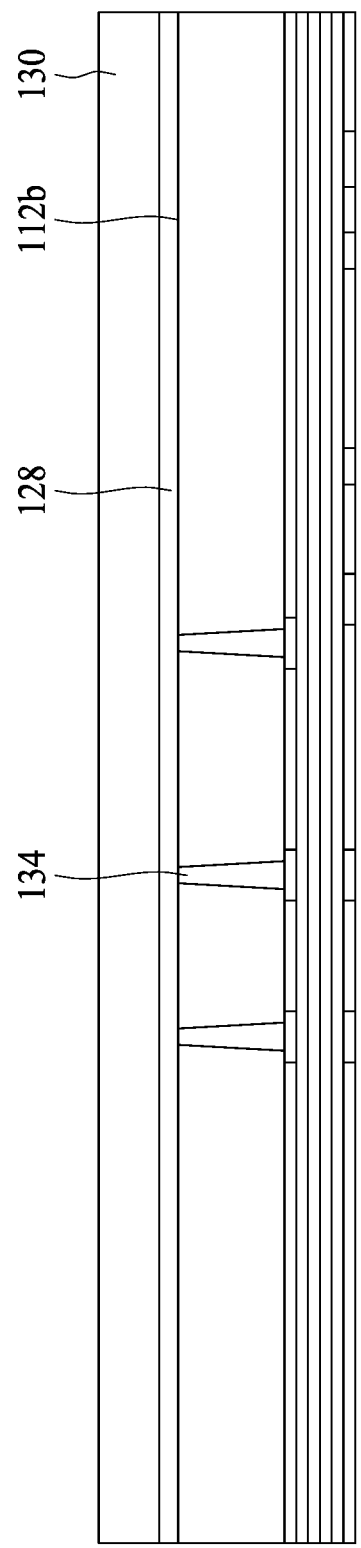
FIG. 14 is a schematic view of a semiconductor device with a conductive layer in accordance with some embodiments.

In some embodiments, conductive material like 155 is disposed on the backside 112b of substrate 112. Referring to FIG. 13, a die 100 as in FIG. 1 is provided and in FIG. 14, conductive layer 130 is disposed on the backside 112b. The substrate 112 further has several through substrate via (TSV) 134. In some embodiments, an insulating layer 128 is disposed between the backside 112b and the conductive layer 130.

Figure 15:
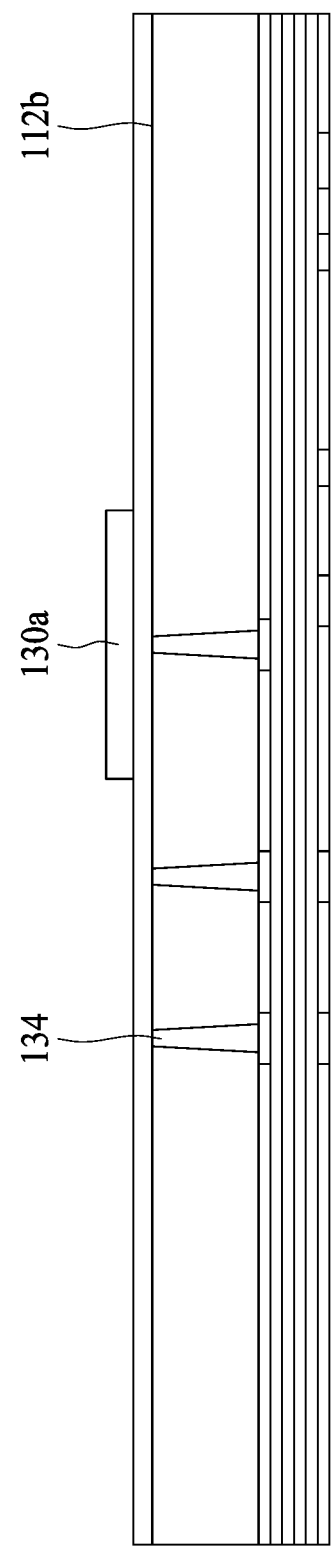
FIG. 15 is a schematic view of a semiconductor device with a pad in accordance with some embodiments.
Figure 16:
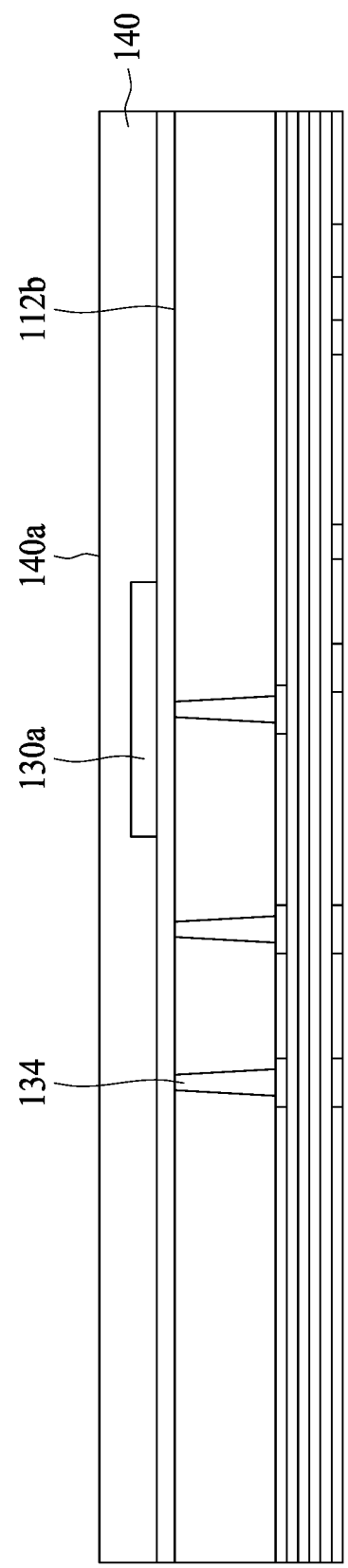
FIG. 16 is a schematic view of a semiconductor device with a dielectric material in accordance with some embodiments.

Referring to FIG. 15, conductive layer 130 is partially removed to form at least one pad 130a over the backside 112b. Referring to FIG. 16, dielectric material 140 is disposed over backside 112b. In some embodiments, dielectric material 140 covers pad 130a. In some embodiments, the dielectric material 140 has a planar surface 140a.

Figure 17:
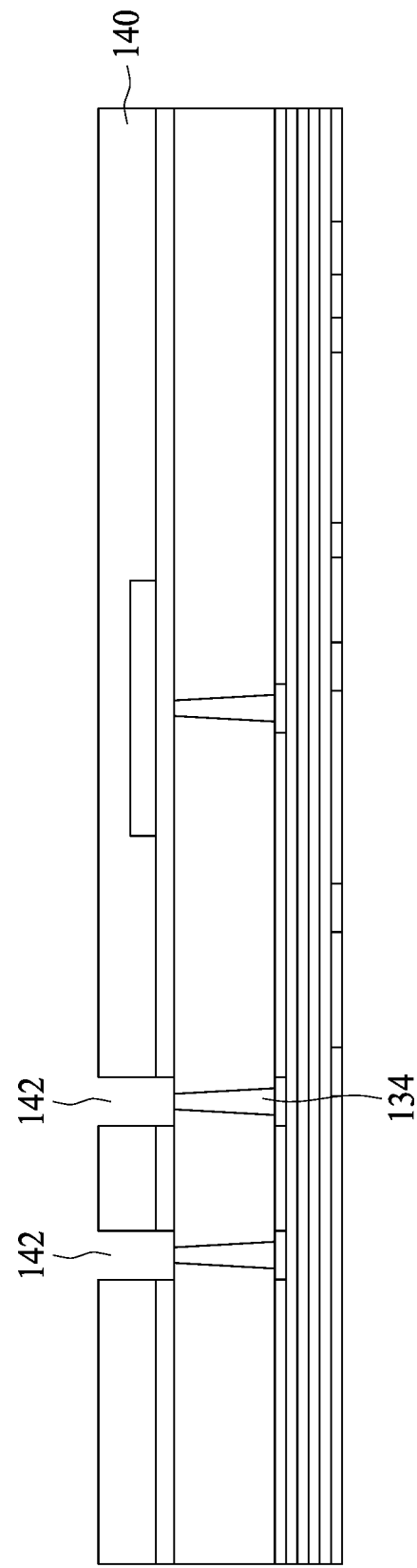
FIG. 17 is a schematic view of a semiconductor device with through holes in accordance with some embodiments.

Referring to FIG. 17, dielectric material 140 is patterned to include several through holes 142 to expose one end of the TSV 134. The patterning operation performed on dielectric material 140 may include several sub-operations. For example, a photoresist is firstly disposed over dielectric material 140 and patterned into a designed mask. A portion of dielectric material 140 is masked by the photoresist. Then an etch operation is adopted to remove the unmasked portions of dielectric material 140.

Figure 18:
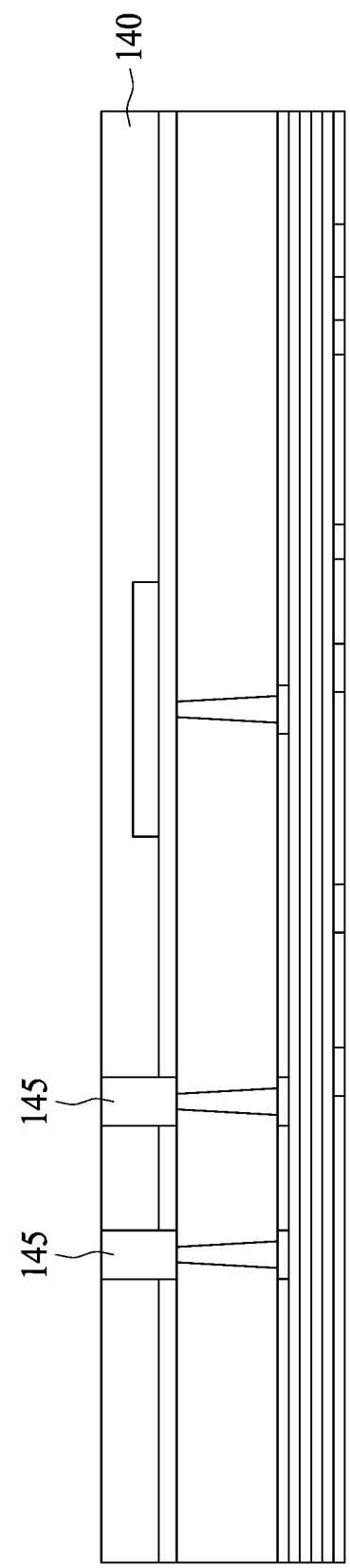
FIG. 18 is a schematic view of a semiconductor device with conductive pillars in accordance with some embodiments.

Referring to FIG. 18, conductive material is filled in through holes 142 to form conductive pillars 145. In some embodiments, conductive material is filled with at least two stages. In a first stage, a thin conductive layer is disposed conformally into through holes 142. The thin conductive layer may include Cu, Ti, Ta, TiN, TaN, or the like, using CVD or PVD techniques. For example, in an embodiment, the thin conductive layer is a composite layer including a layer of Ti is deposited by a PVD process to a thickness of about 500 Å. In the second stage, another conductive material is filled on the seed layer. The filling conductive material can be copper or copper alloy and filled by an electro plating operation. Some through holes 142 may be overfilled by the filling conductive material such that dielectric material 140 is covered thereby. A CMP operation is adopted to remove excessive filling material and form pillars 145 as shown in FIG. 18. Pillars 145 are extended through dielectric material 140 in order to provide contact for an external device.

Figure 19:
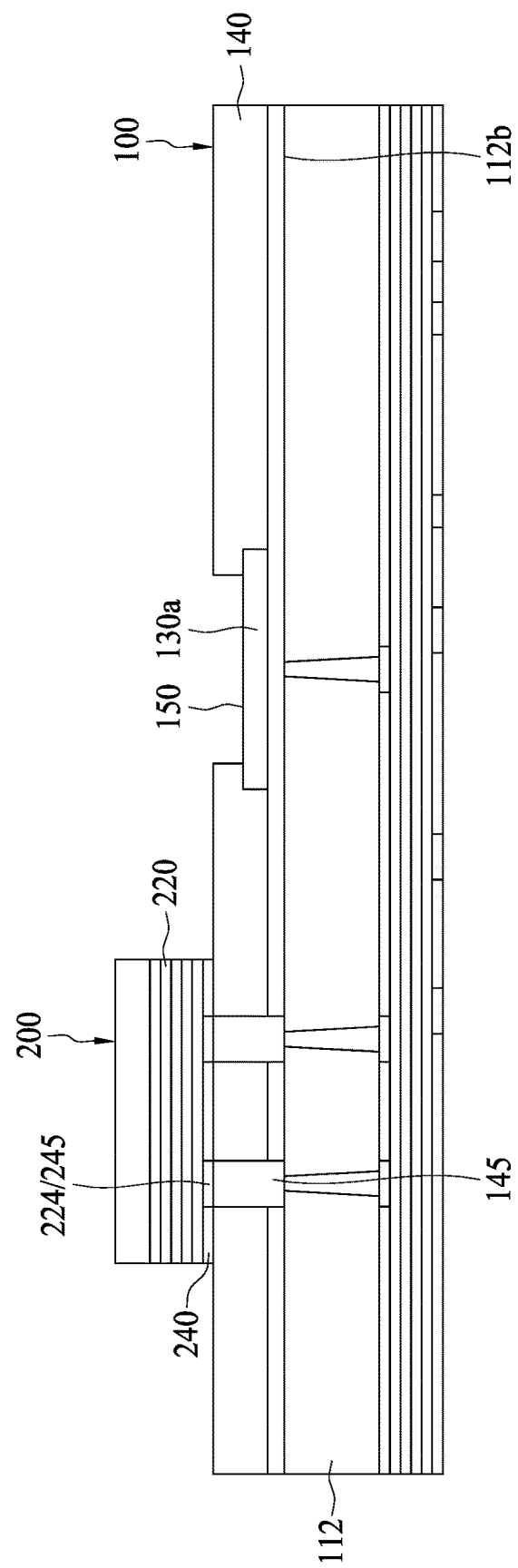
FIG. 19 is a schematic view of a semiconductor device with another die in accordance with some embodiments.

Referring to FIG. 19, another die 200 is disposed over the backside 112b of the substrate 112. In some embodiments, die 200 is a semiconductor chip singulated from a wafer. Before disposing over the front side 112a, die 200 may be experienced a series of wafer level semiconductor operations. For example, a semiconductor wafer is provided and devices such as CMOS, diode, etc. are formed in the semiconductor substrate. Interconnect layer 220 similar to interconnect 120 may be included and disposed over the active surface of die 200. On the upper most level of the interconnect 120, a dielectric 240 is disposed as a passivation layer to isolate moisture penetrating into the interconnect layer 220, however, some conductive pads 224 are exposed from the dielectric layer 240. The die 200 may be then singulated from the wafer and relocated to be over the substrate 112. Conductive pillar 245 (in FIG. 19 is merged with conductive pad 224 in one piece) is disposed on exposed conductive pads 224 and acts as an electrical communication terminal of die 200. Conductive pillar 245 can be disposed on exposed conductive pads 224 before or after the singulation operation.

Die 200 is bonded with die 100. Conductive pillar 245 of die 200 is bonded to conductive pillar 145 of die 100. The bonding between die 100 and die 200 may involve a direct metal-to-metal bonding, a direct dielectric-to-dielectric bonding, and a metal-to-dielectric bonding. The direct metal-to-metal bonding is on the interface between conductive pillar 145 and conductive pillar 245. The direct dielectric-to-dielectric bonding is on the interface between dielectric layer 140 and dielectric layer 240. The metal-to-dielectric bonding is on the interface between conductive pillar 145 and dielectric layer 240, or the interface between conductive pillar 245 and dielectric layer 140. Once die 100 is bonded with die 200, electrical communication path is formed through the connection of conductive pillar 145 and conductive pillar 245. Mechanical connection is also formed between die 100 and die 200 through the dielectric-to-dielectric bonding or the metal-to-dielectric bonding.

Still Referring to FIG. 19, dielectric layer 140 is partially removed in order to expose pad 130a. In some embodiments, the removal portion is smaller than the width of pad 130a so as to have the pad 130a still partially covered by the dielectric layer 140. The dielectric layer 140 is recessed at pad 130a and have surface 150 exposed.

Figure 20:
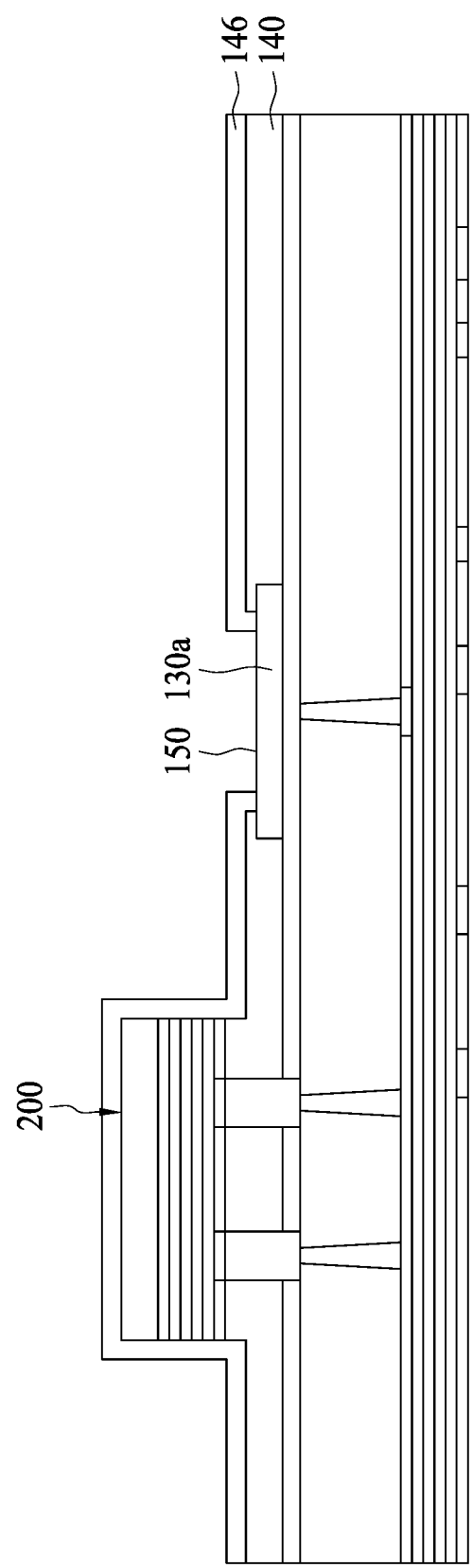
FIG. 20 is a schematic view of a semiconductor device with a polymeric layer in accordance with some embodiments.

Referring to FIG. 20, a polymeric layer 146 is disposed over the dielectric layer 140. A portion of the polymeric layer 146 is removed and to have a through hole overlapped with the recess of the dielectric layer 140. In some embodiments, surface 150 of the pad 130a is partially exposed from the dielectric layer 140 and polymeric layer 146.

In some embodiments, die 200 is not covered by the polymeric layer 146 but partially surrounded by the polymeric layer 146. The interconnect layer 220 is substantially surrounded by the polymeric layer 146. Photo sensitive material can be selected to form the polymeric layer 146. For example, polyimide is selected to be spin coated on over the dielectric layer 140. A reticle is used in a stepper or scanner to define the pattern to be transferred to the photo sensitive material through an exposure operation under a predetermined wavelength light.

Figure 21:
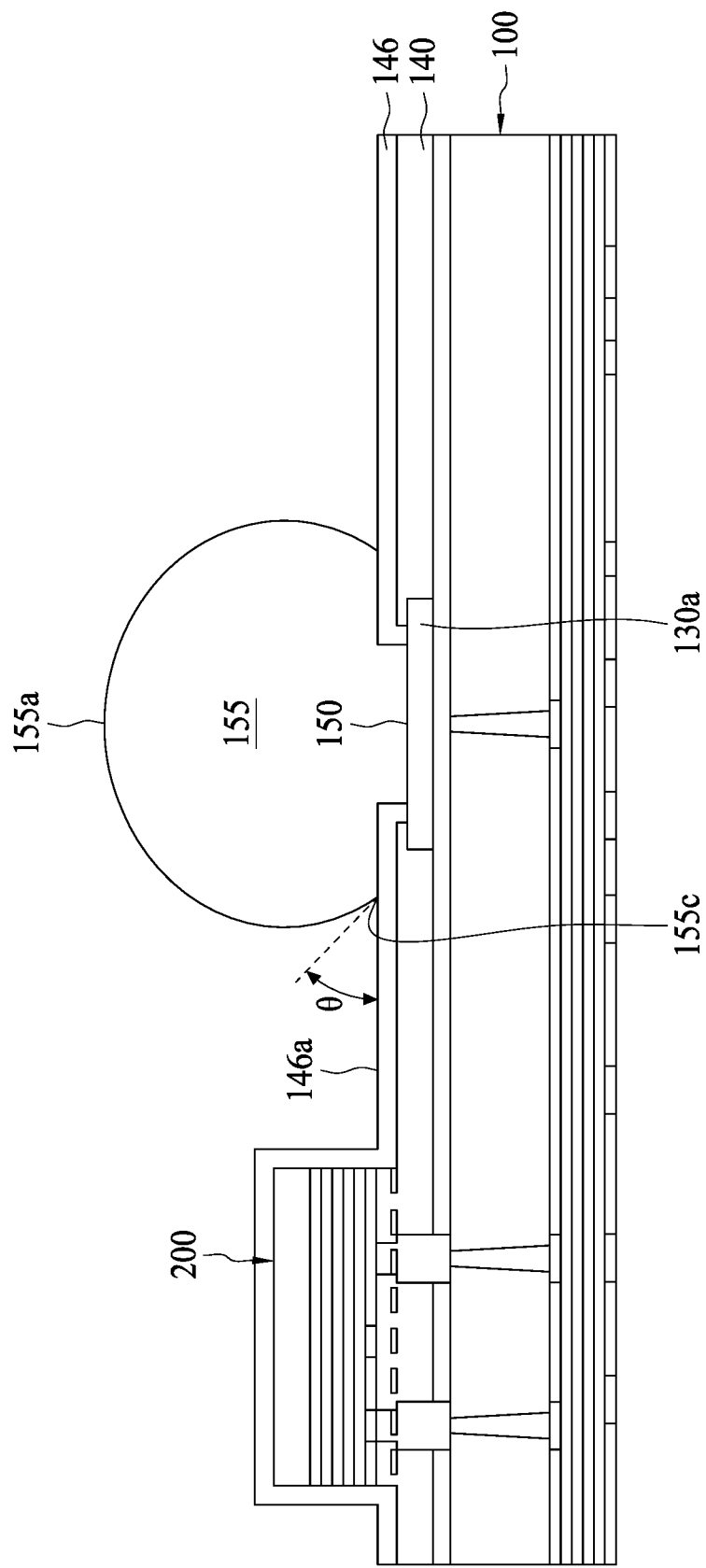
FIG. 21 is a schematic view of a semiconductor device with a conductive material in accordance with some embodiments.

Referring to FIG. 21, a conductive material 155 is configured to be disposed on the exposed surface 150 and fills the through hole in the polymeric layer 146. Similar to FIG. 11, the conductive material 155 is extended through the through hole in the polymeric layer 146 and dielectric layer 140. The conductive material 155 is also in contact with the exposed surface 150 of pad 130a. Through the bonding between die 100 and 200, die 200 is further electrically communicating with conductive material 155 through die 100. Therefore, conductive material 155 is a conductive terminal of the integrated bonded structure, which includes die 100 and die 200.

In some embodiments, conductive material 155 overfills the through hole in polymeric layer 146 and further covers a portion of polymeric layer 146. Conductive material 155 is extended from the exposed surface 150 of pad 130a then turns laterally and attach along top surface 146a of polymeric layer 146. The lateral extension of conductive material 155 is ended at a turning point 155c and then changes upwardly to form a curve intersected with the top surface 146a.

The curve 155a is an external surface of the conductive material 155 and is configured to be in contact with another electronic component or circuitry external to the integrated bonded semiconductor die structure. An angle θ is formed at the intersection of curve 155a and top surface 146a of polymeric layer 146. The value of θ is determined by the surface tension between conductive material 155 and polymeric layer 146. In the embodiment in FIG. 11, conductive material 155 is repelled to polymeric layer 146 and angle θ is smaller than about 90 degrees. In some embodiments, the angle θ is smaller than about 80 degrees. In some embodiments, the angle θ is a wetting angle between conductive material 155 and polymeric layer 146.

The conductive material 155 is electrically communicated with die 100 and die 200 through pad 130a. In some embodiments, there is a redistribution layer (RDL), which includes conductive trace, or a, through via electrically connecting pad 130a with die 100 or die 200.

Figure 22:
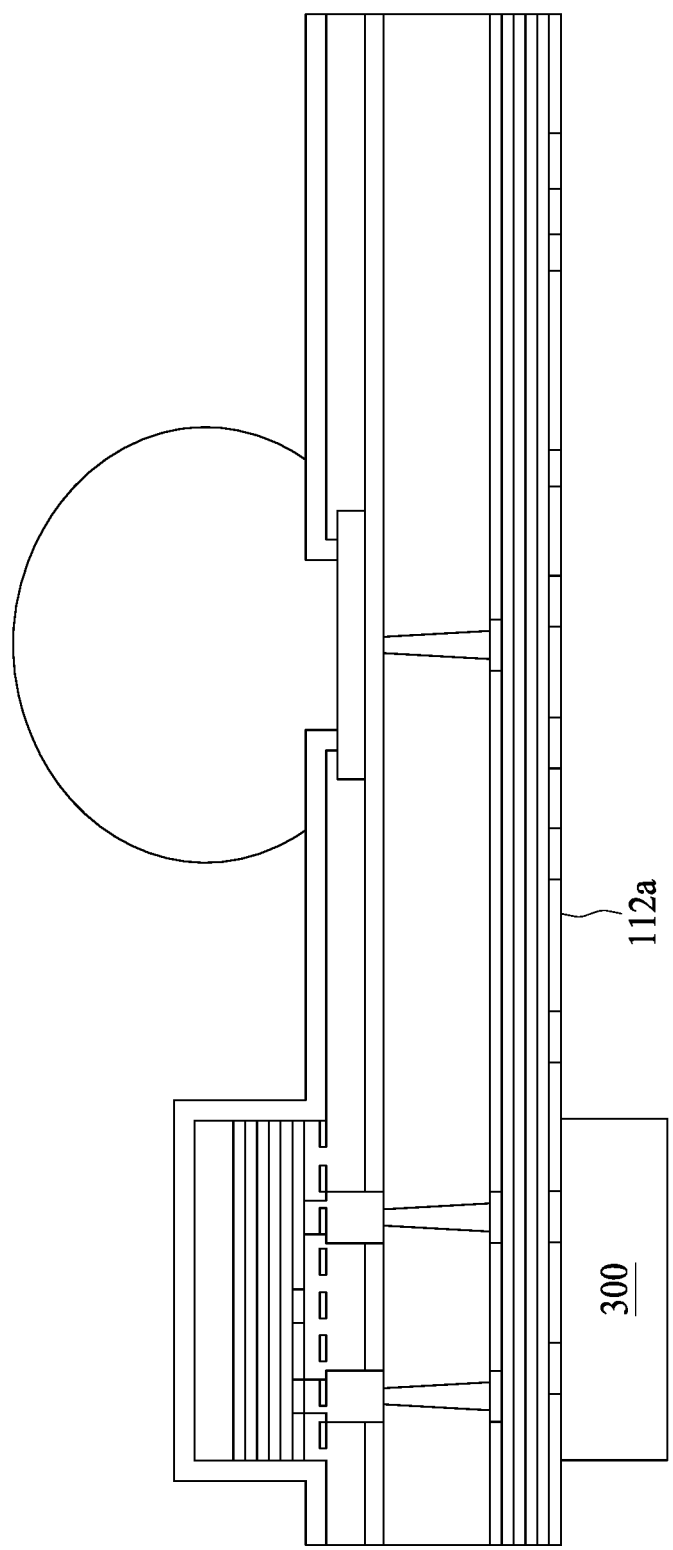
FIG. 22 is a schematic view of a semiconductor device bonding with another electronic component in accordance with some embodiments.

Referring to FIG. 22, another electronic component 300 is bonded to die 100 on the front side 112a. The bonding between die 100 and component 300 may involve a direct metal-to-metal bonding, a direct dielectric-to-dielectric bonding, and a metal-to-dielectric bonding. Once die 100 is bonded with component 300, electrical communication path is formed as well as a mechanical connection. Dies 100, 200, and component 300 form a three-tiered semiconductor structure.

Figure 23:
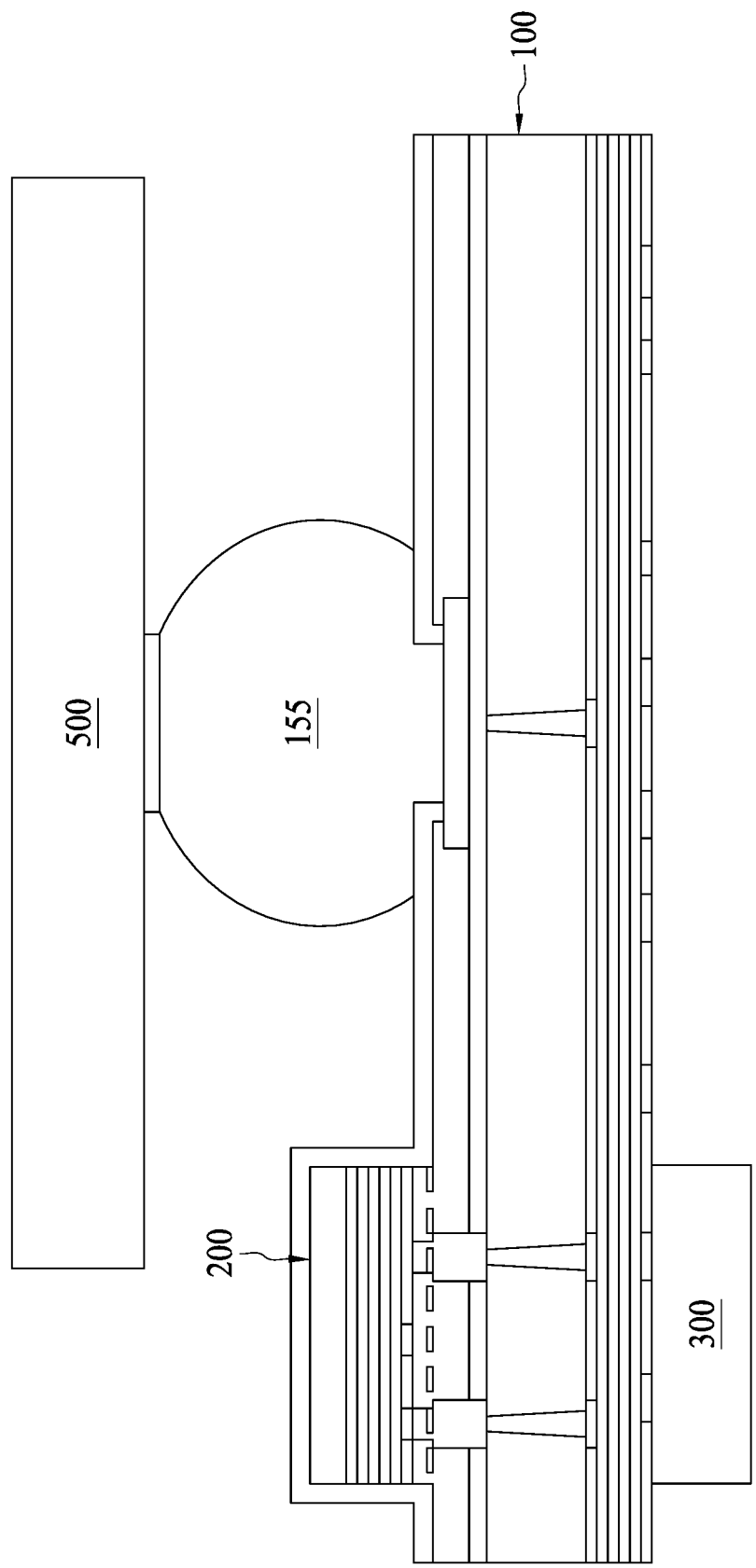
FIG. 23 is a schematic view of a semiconductor device bonding with another substrate in accordance with some embodiments.

Referring to FIG. 23, another substrate 500 is electrically connected to conductive material 155. Through conductive material 155, substrate 500 is electrically communicated with die 100, die 200 or component 300.

In some embodiments, a semiconductor device includes a first die, a second die bonding to the first die thereby forming a bonding interface, and a pad of the first die and exposed from a polymeric layer of the first die. The semiconductor device further has a conductive material on the pad and extended from the pad in a direction parallel to a stacking direction of the first die and the second die. In the semiconductor device, the conductive material extended to a top surface, which is vertically higher than a backside of the second die, wherein the backside is a surface opposite to the bonding interface.

In some embodiments, a sidewall of the second die is covered by the polymeric layer. In some embodiments, the second die is surrounded by the polymeric layer. In some embodiments, the bonding of the second die to the first die comprises a metal-to-metal bond. In some embodiments, the bonding of the second die to the first die comprises a metal-to-dielectric bond. In some embodiments, the second die is electrically connected with the first die through an interconnect of the first die. In some embodiments, the conductive material is a copper pillar. In some embodiments, a portion of the conductive material is in a hemisphere shape.

In some embodiments, the first die further comprises a first substrate having a front side and a backside, and the second die is bonded to the first die on the backside of the first substrate; and wherein the semiconductor device further comprises an electronic component bonded to the first die on the front side of the first substrate. In some embodiments, further comprising a second substrate connected to the conductive material. In some embodiments, the electronic component overlaps the second die and electrically connects to the second die by a through substrate via. In some embodiments, the first die further comprises a substrate and the substrate comprises a backside opposite to the second die.

In some embodiments, a three dimensional (3D) semiconductor device includes a first die 100 and a second die 200 stack over the first die 100 and bonded vertically with a conductive structure of the first die. The semiconductor device further has a pad of the first die electrically communicating with the second die through the bonding of the first die and the second die and a, conductive material disposed over the pad. In the semiconductor device, the conductive material is protruded from the pad and reaches a vertical level higher than the second die.

In some embodiments, further comprising a polymeric layer covers a portion of the pad of the first die and the second die. In some embodiments, the first die further comprises a substrate and a through substrate via (TSV) in the substrate. In some embodiments, the second die is bonded with the TSV. In some embodiments, further comprising a molding partially surrounding the second die.

In some embodiments, a semiconductor device includes a first die, a second die bonded to the first die, and a substrate external to the first die and the second die being electrically connected to the first die and the second die. In the semiconductor device, the first die, the second die, and the substrate are arranged in vertical stacking manner, and a conductive material protruded from a pad of the first die and extended vertically to a level higher the second die. In the semiconductor device, the first die, the second die, and the substrate are mutually communicating through the conductive material.

In some embodiments, the conductive material is in contact with a surface of the polymeric material and curved from the surface. In some embodiments, the conductive material has a lateral extension on the surface of the polymeric material, and the lateral extension extends laterally outside the pad of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first die having a pad;
a dielectric layer over the first die and a portion of the pad;
a second die bonded to the first die and the dielectric layer;
a bonding interface between the second die and at least a portion of the dielectric layer;
a polymeric layer over the dielectric layer and directly contacting a portion of the pad of the first die; and
a conductive material on the pad and extended from the pad, and the conductive material extended to a top surface, which is vertically higher than a backside of the second die, wherein the backside is a surface opposite to the bonding interface.

2. The semiconductor device of claim 1, wherein a sidewall of the second die is covered by the polymeric layer.

3. The semiconductor device of claim 1, wherein the second die is surrounded by the polymeric layer.

4. The semiconductor device of claim 1, wherein the bonding of the second die to the first die comprises a metal-to-metal bond.

5. The semiconductor device of claim 1, wherein the bonding of the second die to the first die comprises a metal-to-dielectric bond.

6. The semiconductor device of claim 1, wherein the second die is electrically connected with the first die through an interconnect of the first die.

7. The semiconductor device of claim 1, wherein the conductive material is a copper pillar.

8. The semiconductor device of claim 1, wherein a portion of the conductive material is in a hemisphere shape.

9. The semiconductor device of claim 1, wherein the first die further comprises a first substrate having a front side and a backside, and the second die is bonded to the first die on the backside of the first substrate; and
wherein the semiconductor device further comprises an electronic component bonded to the first die on the front side of the first substrate.

10. The semiconductor device of claim 9, further comprising a second substrate connected to the conductive material.

11. The semiconductor device of claim 9, wherein the electronic component overlaps the second die and electrically connects to the second die by a through substrate via.

12. The semiconductor device of claim 1, wherein the first die further comprises a substrate and the substrate comprises a backside opposite to the second die.

13. A three dimensional (3D) semiconductor device, comprising:
a first die;
a dielectric layer over the first die;
a second die stack over the first die and bonded vertically with the dielectric layer and a conductive structure of the first die;
a pad of the first die electrically communicating with the second die through the bonding of the first die and the second die, at least a portion of the pad being exposed by the dielectric layer;
a conductive material protruded from the pad to a vertical level higher than the second die; and
a polymeric layer directly covering and contacting a portion of the pad of the first die and directly covering and contacting the second die.

14. The 3D semiconductor device of claim 13, wherein the conductive material is a solder.

15. The 3D semiconductor device of claim 13, wherein the first die further comprises a substrate and a through substrate via (TSV) in the substrate.

16. The 3D semiconductor device of claim 15, wherein the second die is bonded with the TSV.

17. The 3D semiconductor device of claim 13, wherein the polymeric layer surrounds the second die.

18. A semiconductor device, comprising:
a first die;
a second die bonded to the first die;
a hybrid bonding interface between the first die and the second die;
a polymeric layer covering the second die and contacting a portion of a pad of the first die;
a substrate external to the first die and the second die being electrically connected to the first die and the second die, wherein the first die, the second die, and the substrate are arranged in vertical stacking manner; and
a conductive material protruded from the pad of the first die and extended vertically to a level higher the second die, wherein the first die, the second die, and the substrate are mutually communicating through the conductive material.

19. The semiconductor device of claim 18, wherein the conductive material is in contact with a surface of the polymeric material and curved from the surface.

20. The semiconductor device of claim 19, wherein the conductive material has a lateral extension on the surface of the polymeric material, and the lateral extension extends laterally outside the pad of the first die.

* * * * *